United States Patent
Nakahara et al.

(10) Patent No.: US 11,189,991 B2
(45) Date of Patent: Nov. 30, 2021

(54) SEMICONDUCTOR OPTICAL ELEMENT AND SEMICONDUCTOR OPTICAL DEVICE COMPRISING THE SAME

(71) Applicant: Lumentum Japan, Inc., Kanagawa (JP)

(72) Inventors: Kouji Nakahara, Tokyo (JP); Kazuki Suga, Kanagawa (JP)

(73) Assignee: Lumentum Japan, Inc., Kanagawa (JP)

(*) Notice: Subject to any disclaimer, the term of this patent is extended or adjusted under 35 U.S.C. 154(b) by 34 days.

(21) Appl. No.: 16/845,231

(22) Filed: Apr. 10, 2020

(65) Prior Publication Data

US 2021/0044089 A1   Feb. 11, 2021

(30) Foreign Application Priority Data

Aug. 8, 2019 (JP) ............................. JP2019-146767
Nov. 5, 2019 (JP) ............................. JP2019-201007

(51) Int. Cl.
  *H01S 5/00*  (2006.01)
  *H01S 5/227*  (2006.01)
  (Continued)

(52) U.S. Cl.
  CPC ............ *H01S 5/227* (2013.01); *H01S 5/0424* (2013.01); *H01S 5/12* (2013.01); *H01S 5/18347* (2013.01);
  (Continued)

(58) Field of Classification Search
  CPC .... H01S 5/227; H01S 5/0424; H01S 5/18347; H01S 5/32333; H01S 5/34326;
  (Continued)

(56) References Cited

U.S. PATENT DOCUMENTS 5,805,628 A * 9/1998 Karakida .................. H01S 5/10
                                                           372/46.01
6,323,507 B1 * 11/2001 Yokoyama .............. H01S 5/227
                                                              257/79

(Continued)

FOREIGN PATENT DOCUMENTS

| JP | 2013-165133 A | 8/2013 |
| JP | 2018-056212 A | 4/2018 |
| JP | 2018-093002 A | 6/2018 |

*Primary Examiner* — Kinam Park
(74) *Attorney, Agent, or Firm* — Harrity & Harrity, LLP

(57) ABSTRACT

A semiconductor optical element is configured to emit or absorb light and includes a lower structure that includes a multiple quantum well layer; an upper mesa structure that is disposed on the lower structure; a current injection structure that is disposed on the upper mesa structure, when seen from an optical axis of the emitted or absorbed light, a width of a portion of the current injection structure in contact with the upper mesa structure is smaller than a width of the upper mesa structure, the portion of the current injection structure in contact with the upper mesa structure consisting of InP, and an average refractive index of the upper mesa structure is higher than a refractive index of the InP forming the current injection structure; and an insulating film covering both side surfaces of the upper mesa structure and a part of an upper surface of the upper mesa structure.

20 Claims, 12 Drawing Sheets

(51) Int. Cl.
*H01S 5/183* (2006.01)
*H01S 5/042* (2006.01)
*H01S 5/343* (2006.01)
*H01S 5/323* (2006.01)
*H01S 5/22* (2006.01)
*H01S 5/12* (2021.01)

(52) U.S. Cl.
CPC ............. *H01S 5/22* (2013.01); *H01S 5/2222* (2013.01); *H01S 5/2275* (2013.01); *H01S 5/32333* (2013.01); *H01S 5/34326* (2013.01)

(58) Field of Classification Search
CPC . H01S 5/2222; H01S 5/22; H01S 5/12; H01S 5/2275
See application file for complete search history.

(56) References Cited

U.S. PATENT DOCUMENTS

| | | | |
|---|---|---|---|
| 6,839,369 B2* | 1/2005 | Iwai | H01S 5/18311 372/45.01 |
| 2013/0208751 A1* | 8/2013 | Nakahara | B82Y 20/00 372/45.011 |
| 2018/0090910 A1* | 3/2018 | Nakahara | H01S 5/2275 |
| 2018/0152005 A1* | 5/2018 | Kitatani | H01S 5/4087 |
| 2019/0348818 A1 | 11/2019 | Kitatani et al. | |

* cited by examiner

SEMICONDUCTOR OPTICAL ELEMENT AND SEMICONDUCTOR OPTICAL DEVICE COMPRISING THE SAME

CROSS-REFERENCE TO RELATED APPLICATIONS

The present application claims priority from Japanese patent applications JP 2019-146767, filed on Aug. 8, 2019, and JP 2019-201007, filed on Nov. 5, 2019, the contents of which is hereby incorporated by reference into this application.

TECHNICAL FIELD

The present disclosure relates to a semiconductor optical element and a semiconductor optical device.

BACKGROUND

The Internet has been increasingly developed as an infrastructure of modern society. Optical communication that is high-speed and is excellent in long distance communication accounts for most part of the Internet communication, and an increase in transmission capacity is an urgent matter due to a continuous increase in Internet traffic. For this optical communication, an optical transceiver is used, and an increase in speed and a reduction in size and power consumption are required.

The optical transceiver is high-speed and small-sized and has excellent power-saving properties, and a semiconductor laser that can output light having a wavelength suitable for optical fibers is used as a light source of the optical transceiver. As a transmission light source for optical communication employing a semiconductor laser, in general, a direct modulation method of significantly modulating an injection current to perform digital modulation on a light intensity is widely used.

Along with an increase in the speed of the optical transceiver, a semiconductor laser that can further increase the speed is required. To that end, it is effective to increase a relaxation oscillation frequency of a semiconductor laser. In a semiconductor laser having a quantum well, it is known that the relaxation oscillation frequency is proportional to the square root of the optical differential gain and that the gain changes linearly with respect to the natural logarithm of the carrier density. Therefore, in order to increase the optical gain, it is necessary to increase the carrier density. On the other hand, when the carrier density increases, the optical differential gain may decrease such that the relaxation oscillation frequency may decrease.

A buried laser in which a part of a mesa-stripe is buried in a semiconductor laser may include InGaAlAs as an active layer. A mesa-stripe may be formed on an InP semiconductor substrate, and the mesa-stripe may include an InP cladding that is formed as an upper layer; and a diffraction grating or separate confinement heterostructure layer (SCH layer) and a multiple quantum well layer (MQW layer) that are provided below the InP cladding. An InP buried layer may be disposed on both sides of the semiconductor multi-layer formed below the upper InP cladding. A structure may include an upper cladding layer and the diffraction grating layer that are not buried and an upper surface of the buried layer that is disposed between the MQW layer and the diffraction grating layer. An arrayed semiconductor optical element may include a plurality of mesa structures that are not buried. From the viewpoint of an increase in speed, it is necessary to improve optical confinement in order to realize a higher speed.

SUMMARY

According to some possible implementations, a semiconductor optical element configured to emit or absorb light comprises a lower structure that includes a multiple quantum well layer; an upper mesa structure that is disposed on the lower structure; a current injection structure that is disposed on the upper mesa structure, when seen from an optical axis of the emitted or absorbed light, a width of a portion of the current injection structure in contact with the upper mesa structure is smaller than a width of the upper mesa structure, the portion of the current injection structure in contact with the upper mesa structure consisting of InP, and an average refractive index of the upper mesa structure is higher than a refractive index of the InP forming the current injection structure; and an insulating film covering both side surfaces of the upper mesa structure and a part of an upper surface of the upper mesa structure.

According to some possible implementations, a semiconductor optical device comprises a semiconductor optical element configured to emit or absorb light and comprising: a lower structure that includes a multiple quantum well layer; an upper mesa structure that is disposed on the lower structure; a current injection structure that is disposed on the upper mesa structure, when seen from an optical axis of the emitted or absorbed light, a width of a portion of the current injection structure in contact with the upper mesa structure is smaller than a width of the upper mesa structure, the portion of the current injection structure in contact with the upper mesa structure consisting of InP, and an average refractive index of the upper mesa structure is higher than a refractive index of the InP forming the current injection structure; and an insulating film covering both side surfaces of the upper mesa structure and a part of an upper surface of the upper mesa structure; and a semiconductor laser integrated with the semiconductor optical element.

DETAILED DESCRIPTION

The following detailed description of example implementations refers to the accompanying drawings. The same reference numbers in different drawings may identify the same or similar elements.

Figure 1:
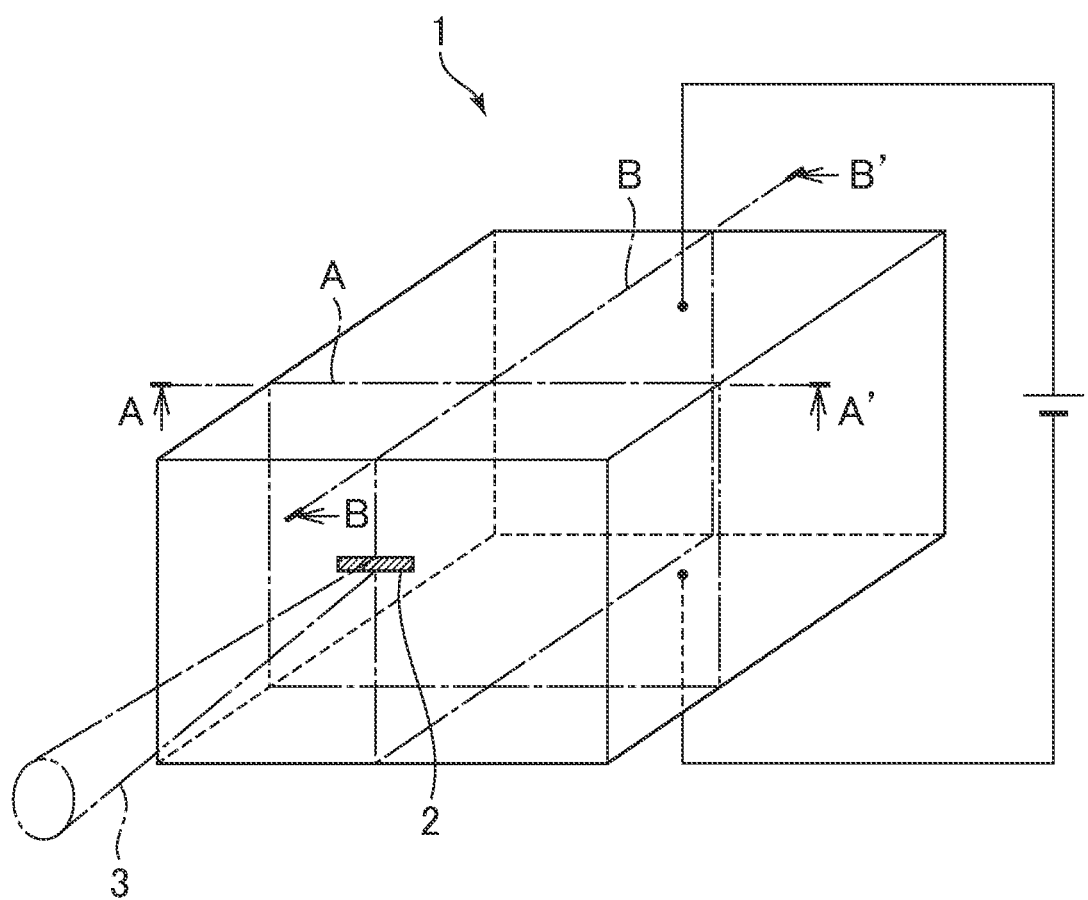
FIG. 1 schematically illustrates a semiconductor optical element according to a first example.

FIG. 1 schematically illustrates a semiconductor optical element 1 according to an implementation. The semiconductor optical element illustrated in FIG. 1 is a semiconductor laser and emits laser light 3 from an oscillation region 2 by applying a voltage to two electrodes that are provided on rectangular surfaces facing each other.

Figure 2:
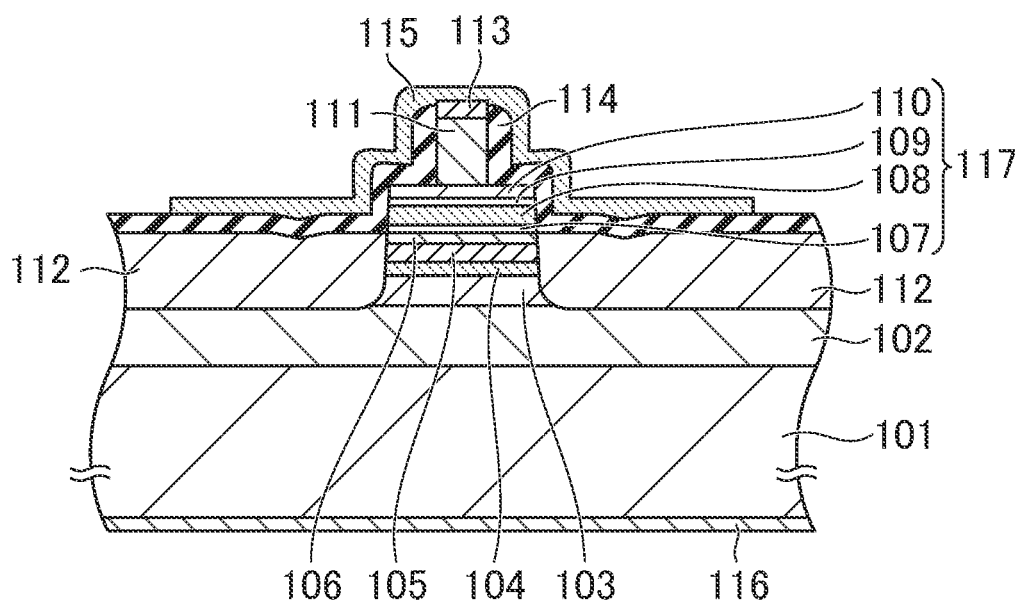
FIG. 2 is a cross-sectional view illustrating a cross-section along an A-A' line in FIG. 1.
Figure 3:
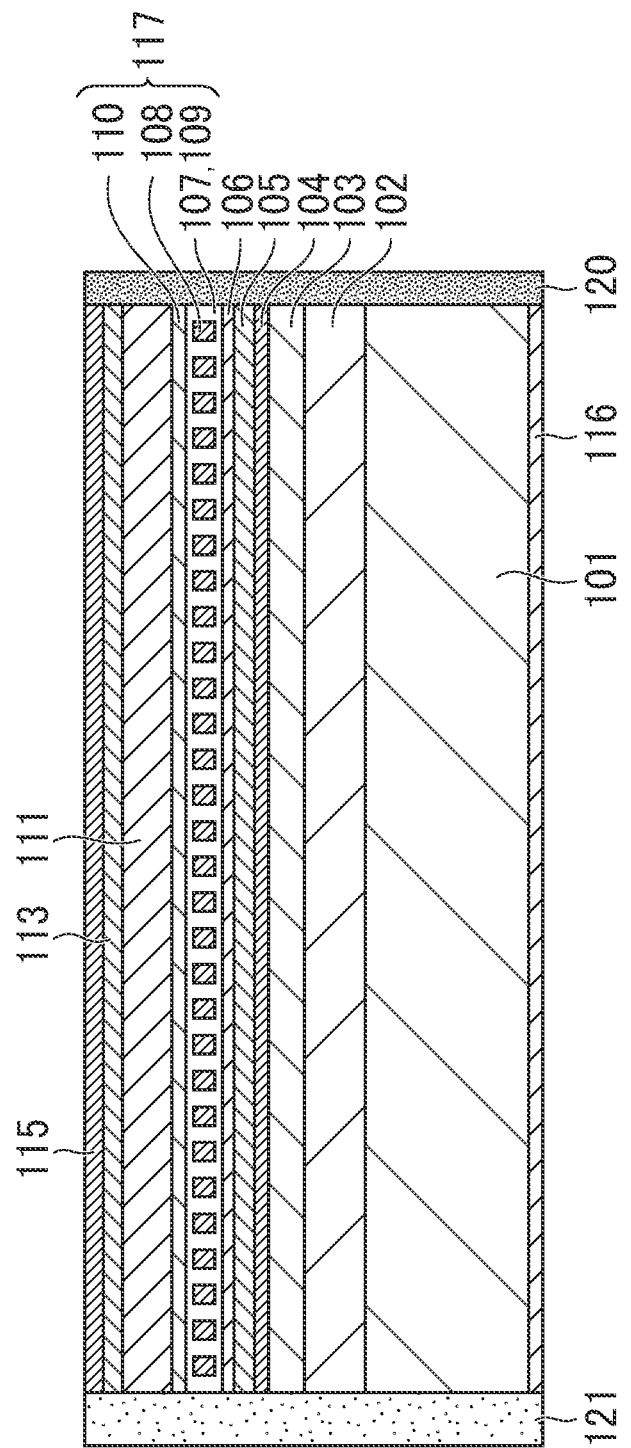
FIG. 3 is a schematic longitudinal sectional view along a B-B' line in FIG. 1 that is parallel to a resonator direction of the semiconductor optical element.

FIG. 2 is a cross-sectional view illustrating a cross-section along an A-A' line in FIG. 1. FIG. 2 is a schematic diagram illustrating a cross-section perpendicular to an optical axis of a semiconductor laser that oscillates in a 1.3 μm band of a transmission light source for optical fiber communication. In the semiconductor optical element 1, a p-type InP semiconductor substrate 101, a p-type InP buffer layer 102 functioning as a lower cladding, a p-type InGaAlAs-separate confinement heterostructure (SCH) layer 103, a p-type InAlAs electron stop layer 104, an InGaAlAs-multiple quantum well (MQW) layer 105, and an n-type InGaAlAs-SCH layer 106 are laminated in this order. The p-type InP buffer layer 102 to the n-type InGaAlAs-SCH layer 106 have configurations of a typical semiconductor laser such as doping or a composition. Further, immediately above the SCH layer 106, an n-type InP layer 107 having a thickness of 2 nm, an n-type InGaAsP diffraction grating layer 108 having a thickness of 60 nm, an n-type InP layer 109 having a thickness of 40 nm, and an n-type InGaAsP layer 110 having a thickness of 80 nm are laminated in this order. All the doping concentrations of the n-type semiconductor layers 107 to 110 are $1 \times 10^{18}$ cm$^{-3}$. The diffraction grating layer 108 has a diffraction grating structure in a direction perpendicular to the paper plane. In a cross-section along a B-B' line in FIG. 1, the n-type InGaAsP diffraction grating layer 108 is periodically present in the n-type InP layers 107 and 109 as illustrated in FIG. 3. FIG. 3 illustrates a completely periodic structure. However, actually, a λ/4 shift structure or the like is introduced to realize single-mode oscillation with a high yield. The semiconductor optical element 1 is a DFB semiconductor laser. In FIG. 3, 120 represents a low-reflection dielectric coating film and 121 represents a high-reflection dielectric coating film.

A part of 102 and both sides of 103 to 106 form a mesa structure (hereinafter, referred to as "lower mesa structure") that is buried with an InP buried layer 112. The InP buried layer has a multi-layer structure in which an n-type InP thin film is formed in a layer in contact with the p-type InP buffer layer 102 and a semi-insulating InP layer doped with Fe or Ru having high resistance is formed. Alternatively, the InP buried layer may be any one of a p-type semiconductor layer, a multi-layer film including a p-type semiconductor layer and an n-type semiconductor layer, or a multi-layer film including a high-resistance semiconductor layer, a p-type semiconductor layer, and an n-type semiconductor layer. Both sides of 107 to 110 are covered with a SiO$_2$ insulating film 114. 107 to 110 form an upper cladding layer 117. In the semiconductor laser, a waveguide is formed to guide light in an optical axis direction in which laser light is emitted using a combination of the upper cladding layer 117, the SCH layers 103 and 106, the MQW layer 105, and the InP buffer layer 102 functioning as a lower cladding layer. An n-type InP current injection layer 111 having a smaller width than 110 is provided on the n-type InGaAsP layer 110. Since the width is less than 110, light leaks to some extent in 111 but is not guided in 111. Accordingly, the height of the current injection layer only has to be typically 0.2 μm or more. Of course, the height of the current injection layer may be more than 0.2 μm depending on problems during the process or the like. However, when the height of the current injection layer is 1 μm or more, element resistance may increase. Therefore, the height of the current injection layer is preferably less than 1 μm, in particular, 0.6 μm or less. Since the left, right, and upper portions of the upper cladding layer 117 are covered with SiO$_2$ having a low refractive index, light can be substantially confined in a region below the upper cladding layer 117. An n-type InGaAsP contact layer 113 having a doping concentration of $1.5 \times 10^{19}$ cm$^{-3}$ is provided immediately above the current injection layer 111 and is in ohmic contact with an n-type electrode 115. 115 only has to be a typical multi-layer electrode for ohmic contact, and Ti/Pt/Au is used in an implementation. A p-type electrode 116 having a multi-layer structure of an AuZn alloy and Ti/Pt/Au is provided below a p-type InP substrate. 116 may also have other configurations as long as it is a typical p-type electrode.

A width $W_a$ of the lower mesa structure is about 0.9 μm. Due to the problems of the process, an actual cross-sectional shape of the mesa structure has a slightly curved contour without being completely rectangular. The width of the upper cladding layer is also about 0.9 μm. These mesa widths may have a difference in a range where light is guided. The width of the current injection layer 111 is about 0.5 μm, and is set to be narrow than the above-described mesa width. In addition, since light is not guided, in particular, it is not necessary that the horizontal center of 111 matches the horizontal axis of the lower mesa structure (102 to 106, 107 to 110).

In addition, in an implementation, the SiO$_2$ insulating film 114 and the n-type electrode 115 are in contact with each other. However, an insulating film such as polyimide may be inserted into a part or the whole of a gap between the SiO$_2$ insulating film 114 and the n-type electrode 115 such that the capacity of the element is reduced.

Here, the semiconductor optical element according to an implementation illustrated in FIG. 2 and the structure disclosed in JP 2018-056212 A are compared to each other. In the semiconductor laser, a true frequency band $f_{3\ dB}$ in which the parasitic capacitance or the like is ignored and a relaxation oscillation frequency $f_r$ have a relationship of $f_{3\ dB}=1.55 f_r$. In order to increase the speed, it is important to improve the relaxation oscillation frequency $f_r$. In the semiconductor laser including the quantum well layer as an active layer, the relaxation oscillation frequency $f_r$ has the following relationship with an optical confinement factor $\Gamma_{QW}$ per quantum well, the width $W_a$ of the lower mesa structure, the optical differential gain dg/dn of the quantum well layer, and a drive current $I_m$(=operating current-threshold current).

$$f_r \propto \sqrt{\frac{\Gamma_{QW} \frac{dg}{dn} I_m}{W_a}} \qquad (1)$$

In addition, the semiconductor laser is in an oscillation state where light generated from the quantum well layer and the sum of the optical loss $\alpha_i$ of a waveguide in the semiconductor laser and the mirror loss $\alpha_m$ that is loss in the laser generated by laser light exiting to the outside are equal to each other, that is, $g_m=\alpha_4+\alpha_m$. When the optical gain in the semiconductor laser per unit length is represented by g, oscillation conditions are represented by the following expression.

$$g_m=N_w\Gamma_{QW}g \quad (2)$$

Here, $N_W$ represents the number of quantum wells. In addition, the optical gain g is represented by the following expression.

$$g=\alpha(\ln n - \ln n_{tr}) \quad (3)$$

Here, n represents a carrier density injected into quantum wells, $n_{tr}$ represents a carrier density at which the optical gain g is 0, and a represents a constant. It is presumed from Expression (1) that a laser structure where $\Gamma_{QW}/W_a$ increases and $W_a$ decreases is preferable. However, as $W_a$ decreases, $\Gamma_{QW}$ decreases, and it is necessary to increase the optical gain g in Expression (2) representing the oscillation conditions. In order to increase g, it is necessary to inject a larger amount of carriers n than Expression (3). As can be seen from the expression, a function of g and n is a function having a curve that protrudes upward, a differential thereof, that is, the optical differential gain dg/dn decreases along with an increase in carrier density. Therefore, $f_r$ in Expression (1) decreases. Accordingly, a structure in which both $\Gamma_{QW}/W_a$ and $\Gamma_{QW}$ increase is necessary. In addition, when the mirror loss am is high, the optical differential gain decreases as described above. Therefore, it is desirable that am is low. In the DFB laser, as an optical coupling factor κ of a diffraction grating increases, the mirror loss $\alpha_m$ decreases.

Figure 12:
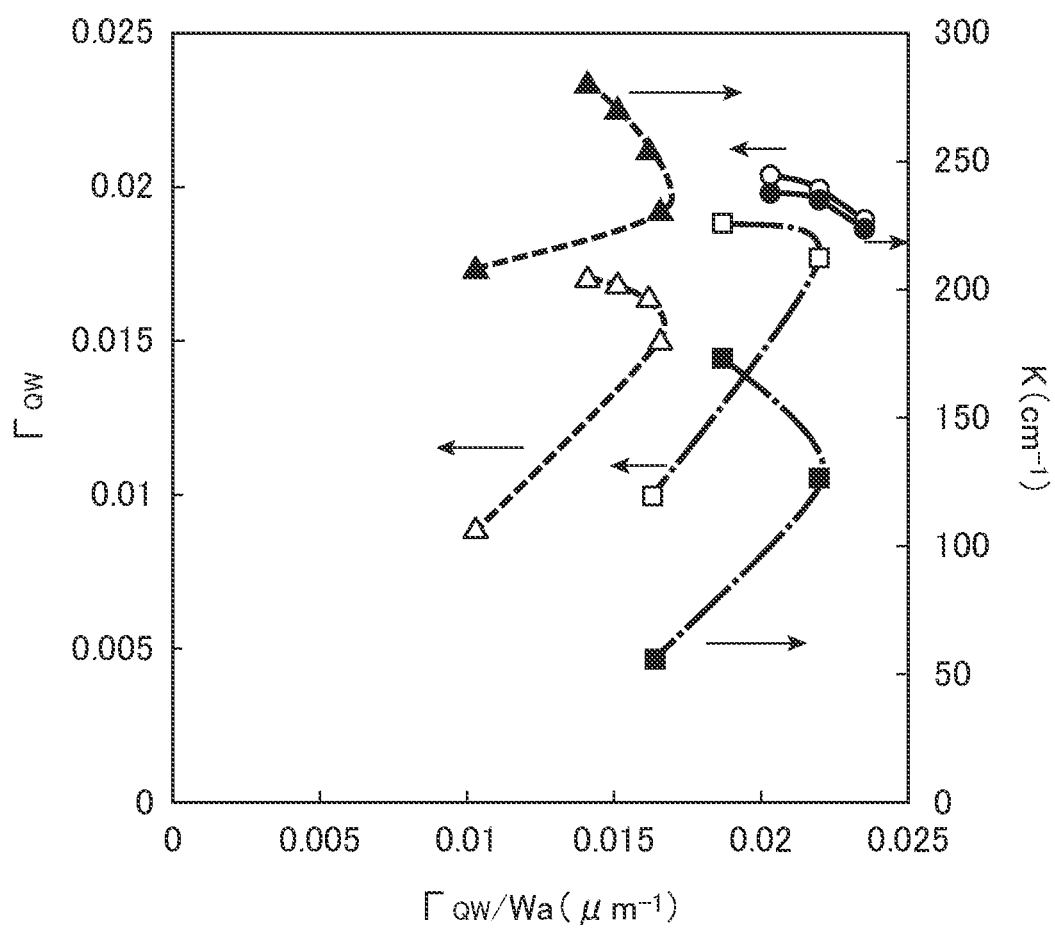
FIG. 12 is a graph illustrating the results of calculating $\Gamma_{QW}/W_m$, $\Gamma_{QW}$, and κ based on JP 2018-056212 A and the features described below.

FIG. 12 illustrate the calculated results of Examples 1 and 3 of JP 2018-056212 A and an implementation at different active layer widths $W_a$ with respect to $\Gamma_{QW}/W_a$ dependence of $\Gamma_{QW}$ and κ. In FIG. 12, white markers represent values of $\Gamma_{QW}$ on the left axis, black markers represent values of κ, square markers represent the calculated results based on Example 1 of JP 2018-056212 A, triangle markers represent the calculated results based on Example 3 of JP 2018-056212 A, and circle markers represent the calculated results based on an implementation. As can be seen from FIG. 12, in Example 1 of JP 2018-056212 A, the values of $\Gamma_{QW}$ and $\Gamma_{QW}/W_a$ are relatively high, but the value of κ is low. Conversely, in Example 3 of JP 2018-056212 A, the value of κ is high, but the values of $\Gamma_{QW}$ and $\Gamma_{QW}/W_a$ are low. On the other hand, according to one or more implementations, all the values of $\Gamma_{QW}$, $\Gamma_{QW}/W_a$, and κ are high. The reason for this is as follows. That is, in this configuration, substantially no light is spread to the current injection layer 111 disposed above the upper cladding layer 117. Therefore, light can be confined in a limited region. Accordingly, the values of $\Gamma_{QW}$ and $\Gamma_{QW}/W_a$ are high. Further, since the diffraction grating 108 is present in the upper cladding layer 117 where light is confined, the value of κ is also high. In JP 2018-056212 A, the InP cladding layer having the same width as the diffraction grating layer is disposed above the diffraction grating layer that is not buried with InP. Therefore, light is also spread to the InP cladding layer, and light cannot be sufficiently confined in a layer below the diffraction grating layer. On the other hand, in an implemenation, the InP layer above the upper cladding layer including the diffraction grating layer is merely a layer provided for current injection and has a very small function as a cladding layer that confines light. This effect can be obtained by setting the mesa width to be narrower than the upper cladding layer. In this structure, light can be sufficiently confined in a structure below the upper cladding layer, and the optical confinement ratio at the same mesa width can be improved. In addition, a configuration where an average refractive index of the upper cladding layer 117 is higher than a refractive index of InP that is a major element of the current injection layer 111 also contributes to this effect. In particular, the upper cladding layer 117 includes the n-type InGaAsP layer 110 that functions as the separate confinement heterostructure layer such that light can be more effectively collected to the upper cladding layer 117 side. As a result, a semiconductor laser having excellent high-speed response can be realized. Further, by burying a semiconductor on the side of the MQW layer, the leakage current on the mesa side portion can be reduced and the MQW layer can be blocked from external air. As a result, the reliability is also high.

In the semiconductor optical element 1 according to an implementation having a resonator length of 150 μm in which an antireflection coating having a reflectance of 0.3% or lower is formed on a front end surface and a high-reflection coating having a reflectance of 95% is formed on a rear end surface by reflecting excellent leakage current blocking characteristics, inclinations of the relaxation oscillation frequency fr with respect to the square root of the drive current at 25□C and 85□C are excellent at 6.6 GHz/mA$^{1/2}$ and 4.8 GHz/mA$^{1/2}$, respectively. Further, the estimated lifetime at 85° C. is $3.2 \times 10^5$ hours, and high reliability can be obtained.

In an implementation, the width $W_a$ of the lower mesa structure is 0.9 μm. The value is not particularly limited as long as $\Gamma_{QW}$ and $\Gamma_{QW}/W_a$ are in a high range, and is desirably 0.4 to 1.4 μm. In consideration of a variation in processes, and the improvement of the values of $\Gamma_{QW}$, κ, and the like, the width of the upper cladding layer is 0.4 μm or more and is desirably $W_a$−0.2 μm to $W_a$+0.05 μm. From the viewpoint of confining light in the upper cladding layer, the width of the current injection layer is at least in a range less than the width of the upper cladding layer by 0.05 μm or more and is desirably in a range of 0.1 μm or more and less than 0.7 μm.

Figure 4:
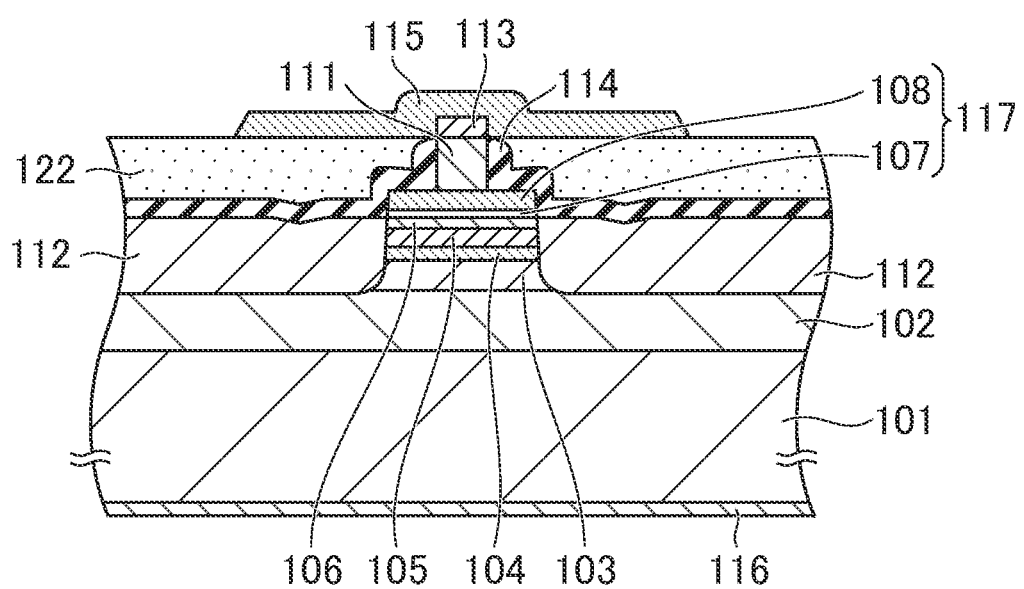
FIG. 4 is a cross-sectional view illustrating the semiconductor optical element according to the first example.
Figure 5:
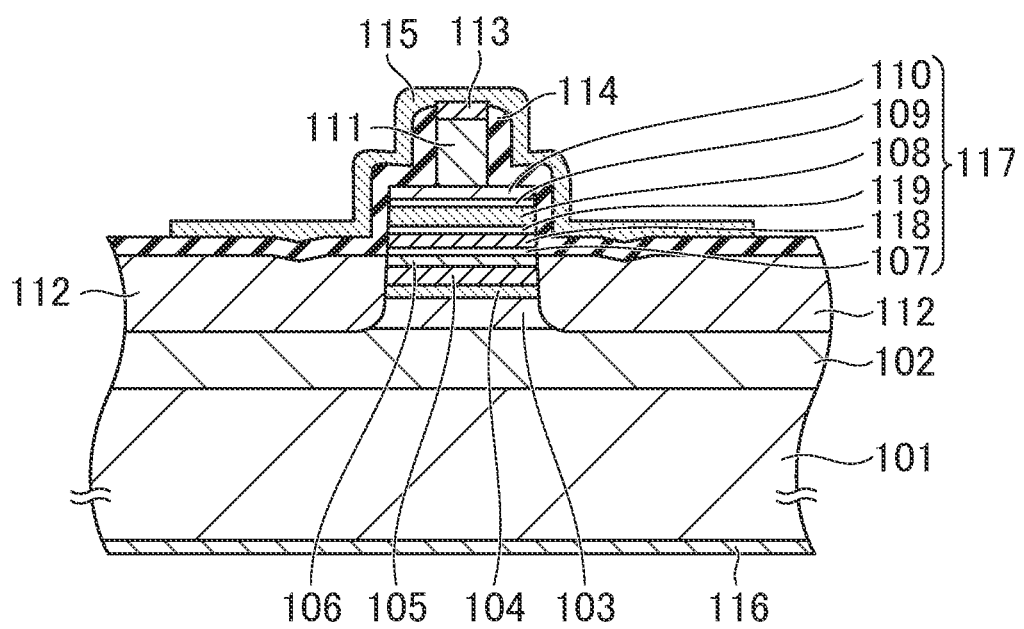
FIG. 5 is a cross-sectional view illustrating the semiconductor optical element according to the first example.

Even when the upper cladding layer 117 according to an implementation is configured with the n-type InP layer 107 and the n-type InGaAsP diffraction grating layer 108 as illustrated in FIG. 4, the same effects can be obtained. Even in this configuration, the average refractive index of the upper cladding layer 117 is higher than InP of the current injection layer 111. In FIG. 4, polyimide as an organic insulating film is inserted into a gap between the n-type electrode 115 and the SiO$_2$ insulating film 114, and the entire capacity of the element is reduced. In addition, even when the upper cladding layer 117 is configured with a multi-layer structure including the n-type InP layer 107, an n-type InGaAsP layer 118, an n-type InP layer 119, the n-type InGaAsP diffraction grating layer 108, the n-type InP layer 109, and the n-type InGaAsP layer 110 as illustrated in FIG. 5, the same effects can be obtained.

Figure 6:
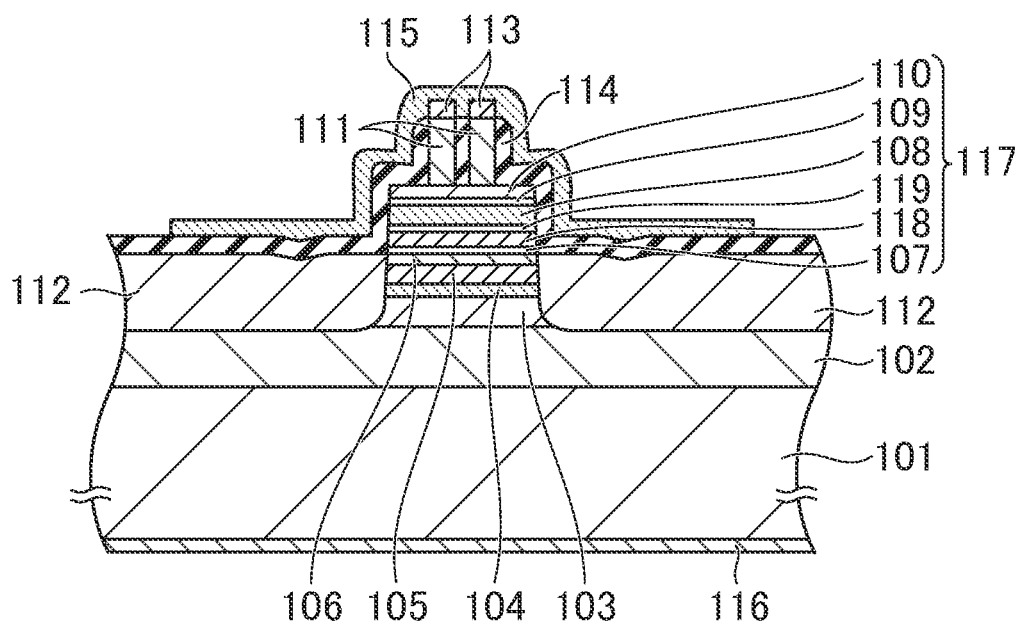
FIG. 6 is a cross-sectional view illustrating the semiconductor optical element according to the first example.

In addition, the current injection layer that is present above the upper cladding layer 117 does not substantially contribute to light guiding. Therefore, the current injection layer 111 may be divided into two parts as illustrated in FIG. 6. Likewise, even when the current injection layer is divided into three or more parts, the same effects can be obtained. With this configuration, the element resistance can be reduced.

In an implementation, the semiconductor laser in which a semiconductor layer that is formed on the p-type InP substrate and above the MQW layer is formed of an n-type semiconductor has been described above. In the buried structure according to an implementation, the leakage current is low. Therefore, the buried structure also operates even in a semiconductor laser structure where all of the p-type semiconductors and the n-type semiconductors are inverted. In this case, the current injection layer 111 is a p-type semiconductor having a high resistivity but does not guide light. Therefore, the height of the current injection layer 111 can be reduced, and thus an increase in resistance can be suppressed.

In addition, even in a semiconductor laser where a semi-insulating substrate doped with Fe is used as the InP substrate and the InP buffer layer 102 is doped with a p-type or an n-type, the same effects can be obtained. In addition, in an implementation, the single semiconductor laser element has been described. Even when an arrayed semiconductor optical device in which a plurality of semiconductor optical elements 1 are arranged on the InP semiconductor substrate, the same effects can be obtained.

In addition, although not illustrated in the drawings of an implementation, the capacity or the like is reduced due to the buried layer. Therefore, an isolation mesa trench may be provided in a region at a distance of 0.5 μm or more from a lower mesa structure end.

Figure 7:
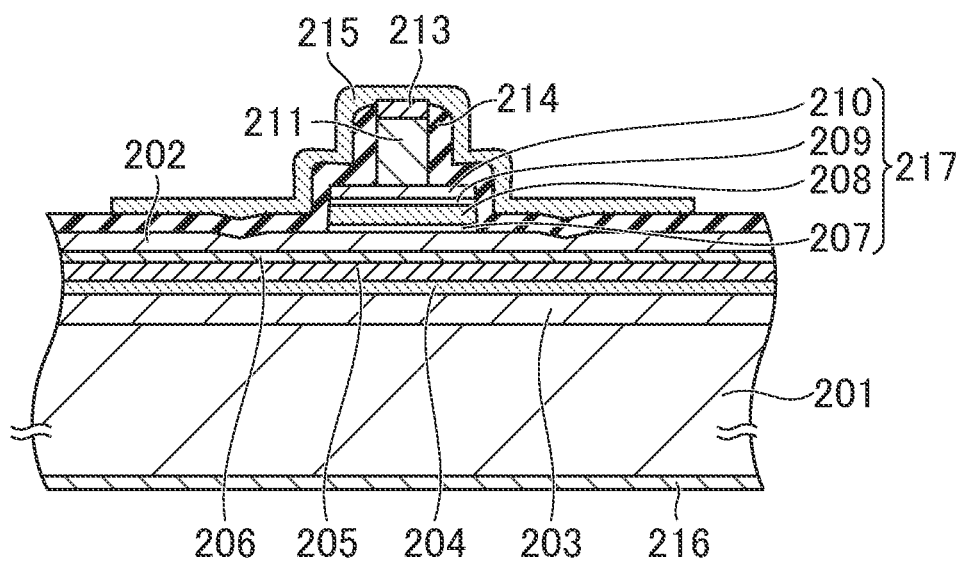
FIG. 7 is a cross-sectional view illustrating a semiconductor optical element according to a second example.
Figure 8:
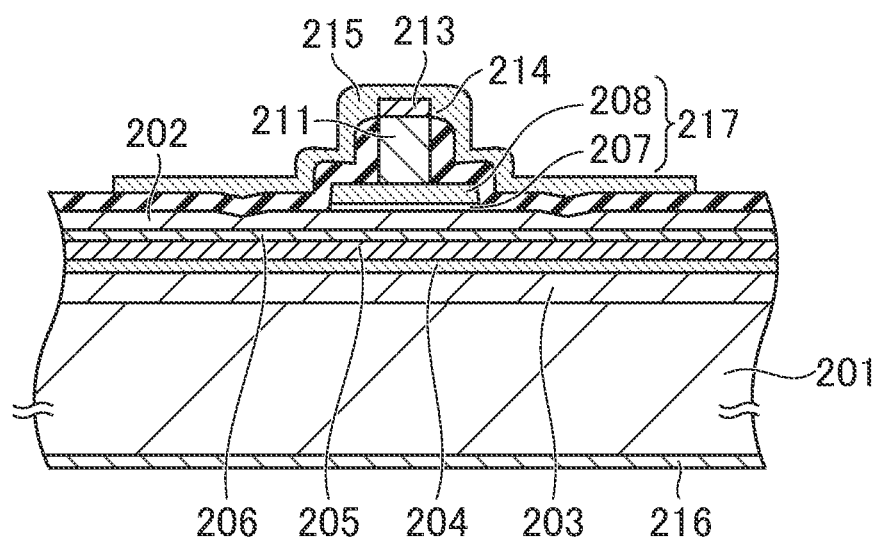
FIG. 8 is a cross-sectional view illustrating the semiconductor optical element according to the second example.

FIG. 7 is a cross-sectional view illustrating a semiconductor optical element according to an implementation. FIG. 8 is a schematic diagram illustrating a cross-section perpendicular to an optical axis of the semiconductor optical element that oscillates in a 1.3 μm band of a transmission light source for optical fiber communication. In the semiconductor optical element according to an implementation, an n-type InGaAlAs-SCH layer 203, a p-type InAlAs layer 204, an InGaAlAs-MQW layer 205, a p-type InGaAlAs-SCH layer 206, a p-type InGaAlAs etch stop layer 202, a p-type InP layer 207, a p-type InGaAsP diffraction grating layer 208, a p-type InP layer 209, and a p-type InGaAsP layer 210 are laminated in this order on an n-type InP semiconductor substrate 201. The n-type InGaAlAs-SCH layer 203 to the p-type diffraction grating layer 208 have configurations of a typical semiconductor laser such as doping or a composition. The diffraction grating layer 208 has a diffraction grating structure in a direction perpendicular to the paper plane of FIG. 8.

The p-type InP layer 207 to the p-type InGaAsP layer 210 form an upper cladding layer 217, and layers below 207 form a lower structure that horizontally spreads centering on the upper cladding layer. The lower structure and the upper cladding layer 217 form a ridge structure. A p-type InP current injection layer 211 having a smaller width than the upper cladding layer 217 is provided on the p-type InGaAsP layer 210. Since the width of 211 is less than that of the upper cladding layer 217, light leaks to some extent but is not guided. Accordingly, the height of the current injection layer only has to be typically 0.2 μm or more. The height of the current injection layer may be more than 0.2 μm depending on problems during the process or the like. In an implementation, the height of 211 is set as 0.5 μm. Since the left, right, and upper portions of the upper cladding layer 217 are covered with a SiO₂ insulating film 214 having a low refractive index, light guided in the laser structure can be confined in the upper cladding layer 217. A p-type InGaAs contact layer 213 having a doping concentration of $2\times10^{19}$ cm$^{-3}$ is provided immediately above the current injection layer 211 and is in ohmic contact with a p-type electrode 215. The p-type electrode 215 only has to be a typical electrode for ohmic contact, and Ti/Pt/Au is used in an implementation. Layers below the n-type InP substrate are electrically connected using an AuGe ohmic contact electrode.

The width of the upper cladding layer 217 is 1.0 μm. The width of the current injection layer 211 is less than that of the upper cladding layer and is 0.5 μm in an implementation. Since light is not guided, the center of the upper cladding layer 217 and the center of the current injection layer 211 do not necessarily match each other. In an implementation, the width of the current injection layer 211 is 0.5 μm. From the viewpoint of confining light in the upper cladding layer, the width of the current injection layer is at least in a range less than the width of the upper cladding layer by 0.05 μm or more and is desirably in a range of 0.1 μm or more and less than 0.7 μm.

In the upper cladding layer of an implementation, the p-type InGaAsP layer 210 is laminated on the upper side of the diffraction grating. The InGaAsP layer 210 has a higher refractive index than the p-type InP current injection layer 211, and the light confine ratio is high. The average refractive index of the upper cladding layer 217 is higher than the refractive index of the p-type InP current injection layer 211. Therefore, leakage of light to be guided to the p-type InP current injection layer 211 is sufficiently suppressed, and, in addition to the effect obtained by the upper cladding layer being covered with the SiO₂ insulating film 214, light can be strongly confined in the upper cladding layer side. As a result, a semiconductor laser having excellent high frequency characteristics can be realized.

In an implementation, the values of κ and $\Gamma_{QW}$ are equal to those of a ridge laser in the related art. However, the value of $\Gamma_{QW}/W_a$ increases by 10% to 20%, the relaxation oscillation frequency $f_r$ is improved, and the frequency band also increases. Although not illustrated in FIG. 7, an isolation trench may be provided at a position at a distance of 2 μm or more from an end of the upper cladding layer 217 in order to reduce the capacity.

In the semiconductor optical element according to an implementation, an antireflection coating having a reflectance of 0.1% or lower is formed on a front end surface and a high reflectance coating having a reflectance of 95% or higher is formed on a rear end surface. In addition, a diffraction grating structure having a resonator length of 140 μm in which an equivalent λ/4 shift is provided at a position at a distance of 40 μm from the rear end surface is obtained. Threshold currents of the semiconductor optical element according to an implementation at 25° C. and 85° C. are 7.3 mA and 15.1 mA, which are low values as a ridge laser. The characteristic temperature at the threshold currents is 82 K which is excellent.

Slope efficiencies at 25° C. and 85° C. are 0.28 W/A and 0.21 W/A, which are excellent. In addition, inclinations of the relaxation oscillation frequency $f_r$ with respect to the square root of the drive current at 25° C. and 85° C. are excellent at 5.2 GHz/mA$^{1/2}$ and 3.9 GHz/mA$^{1/2}$, respectively. Further, the estimated lifetime at 85° C. is $1.9\times10^5$ hours, and high reliability can be obtained.

Even when the upper cladding layer 217 according to an implementation is configured with the p-type InP layer 207 and the p-type InGaAsP diffraction grating layer 208 as illustrated in FIG. 8, the same effects can be obtained.

Figure 9:
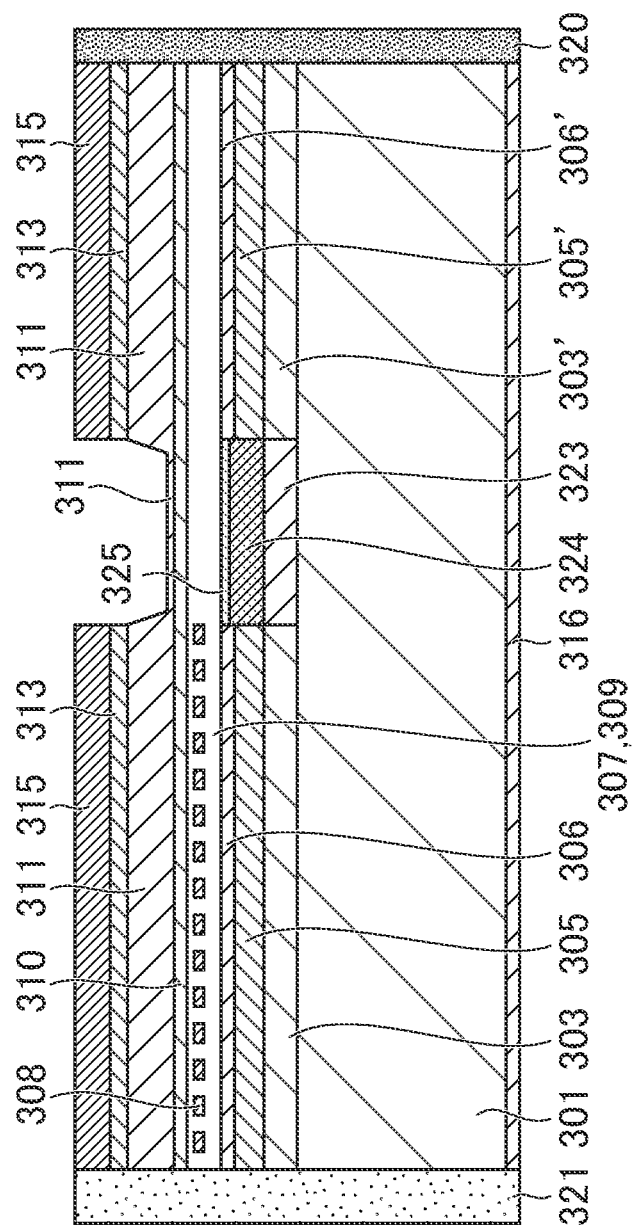
FIG. 9 is a schematic longitudinal sectional view indicated by B in FIG. 1 illustrating a semiconductor optical element according to a third example.
Figure 10:
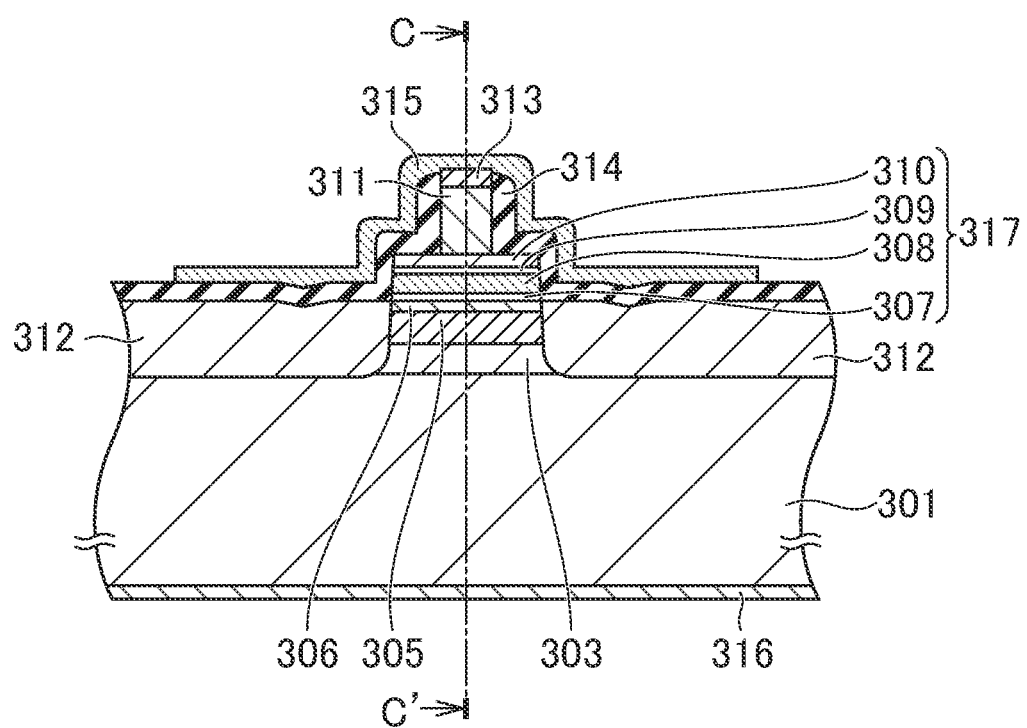
FIG. 10 is a cross-sectional view illustrating the semiconductor optical element according to the third example.
Figure 11:
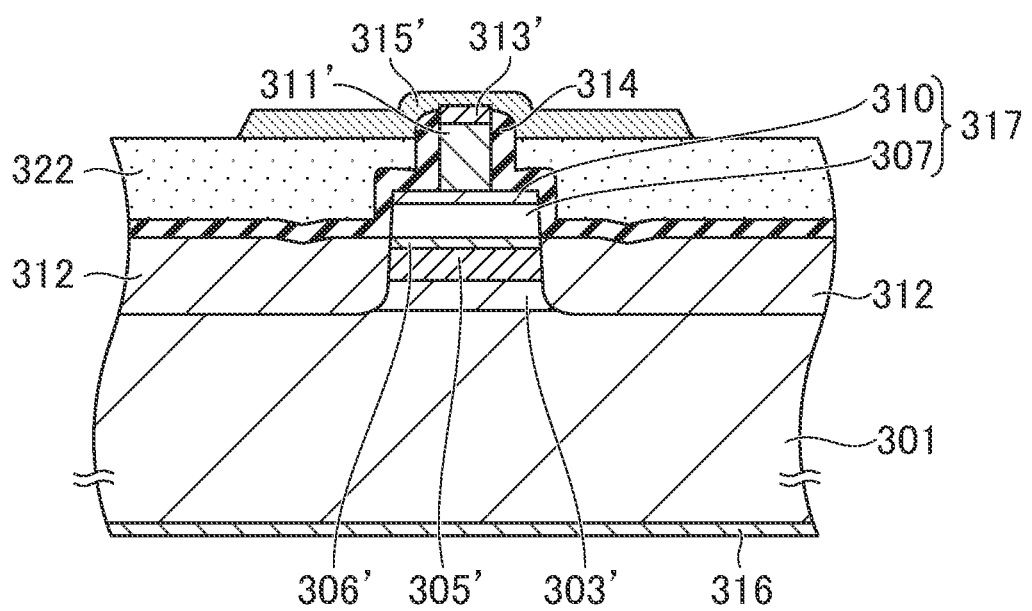
FIG. 11 is a cross-sectional view illustrating the semiconductor optical element according to the third example.

FIGS. 9, 10, and 11 are cross-sectional views illustrating a semiconductor optical device according to an implementation. In the above-described implementations, the direct modulation method is adopted (that is, the current injection structure having a smaller width than the mesa structure provided below the current injection structure is adopted for the semiconductor laser). On the other hand, in an implementation, the above-described current injection structure is adopted for a semiconductor electro-absorption modulator. More specifically, a semiconductor optical device in which a semiconductor laser that oscillates in a 1.3 µm band of a transmission light source for optical fiber communication and an electro-absorption modulator may be integrated. FIG. 9 is a schematic diagram illustrating a cross-section parallel to the optical axis. In FIG. 9, a multi-layer region on the left side is a region of the semiconductor laser, a multi-layer region on the right side is a region of the electro-absorption modulator, and a region around the center is a waveguide layer that optically connects the semiconductor laser and the electro-absorption modulator. FIG. 10 is a cross-sectional view perpendicular to the optical axis of the semiconductor laser region. In the semiconductor laser illustrated in FIG. 10, an n-type InGaAsP-SCH layer 303, an InGaAsP-MQW layer 305, a p-type InGaAsP-SCH layer 306, a p-type InP layer 307, a p-type InGaAsP diffraction grating layer 308, a p-type InP layer 309, and a p-type InGaAsP layer 310 are laminated in this order on an n-type InP substrate 301. The n-type InGaAsP-SCH layer 303 to the p-type InGaAsP diffraction grating layer 308 have configurations of a typical semiconductor laser such as doping, a composition, a thickness, or a diffraction grating structure. A part of the n-type InP substrate 301, the n-type InGaAsP-SCH layer 303, the InGaAsP-MQW layer 305, and the p-type InGaAsP-SCH layer 306 form a mesa structure having a width of 1.0 µm, and the left and right sides thereof are buried with an InP layer 318 doped with Fe or Ru having a high resistance. The p-type InGaAsP layer 310 has a doping concentration of $1 \times 10^{18}$ cm$^{-3}$ and a thickness of 70 nm. As illustrated in FIG. 9, the diffraction grating layer 308 is periodically present in the p-type InP layers 307 and 309. FIG. 9 schematically illustrates a case where the periodic structure is uniformly provided. However, actually, a λ/4 shift structure or the like is introduced to realize single-mode oscillation with a high yield.

The p-type InP layer 307 to the p-type InGaAsP layer 310 form an upper cladding layer 317 having a mesa structure with a width of 1.0 µm, and the left and right sides and a part of the upper side are covered with a SiO$_2$ insulating film 314. A current injection layer 311 having a width of 0.5 µm that is less than that of the upper cladding layer 317 is provided on the p-type InGaAsP layer 310. Since the width of the current injection layer 311 is less than that of the upper cladding layer 317, light leaks to some extent in 311 but is not guided in a resonator direction in 311. Light is guided in the resonator direction by a combination of the upper cladding layer 317, the SCH layers 306 and 303, the MQW layer 305, and the n-type InP substrate 301 functioning as the lower cladding layer. A p-type InGaAs contact layer 313 is provided on the current injection layer 311 and is in ohmic contact with a p-type electrode 315. The current injection layer 311 does not guide light. Therefore, the height of the current injection layer 311 may be small and only has to be 0.2 µm or more. The height of the current injection layer 311 may be more than 0.2 µm depending on problems during the process or the like. In addition, since the current injection layer 311 does not guide light, the center of the current injection layer 311 and the center of a mesa structure 317 below the current injection layer 311 do not necessarily match each other.

FIG. 11 is a cross-sectional view perpendicular to the optical axis of the electro-absorption modulator that is the multi-layer structure on the right side of FIG. 9. In FIG. 11, an EA portion n-type InGaAsP-SCH layer 303', an EA portion InGaAsP-MQW layer 305', an EA portion p-type InGaAsP-SCH layer (lower separate confinement heterostructure layer) 306', the p-type InP layer 307, and the p-type InGaAsP layer (upper separate confinement heterostructure layer) 310 are laminated in this order on the n-type InP substrate 301. The EA portion p-type InGaAsP-SCH layer 306' and the p-type InGaAsP layer 310 have a greater bandgap than the EA portion InGaAsP-MQW layer 305'. That is, the EA portion p-type InGaAsP-SCH layer 306' and the p-type InGaAsP layer 310 have a lower refractive index than the EA portion InGaAsP-MQW layer 305'. The EA portion n-type InGaAsP-SCH layer 303' to the EA portion p-type InGaAsP-SCH layer 306' have configurations of a typical electro-absorption modulator such as doping, a composition, or a thickness. The p-type InP layer 307 and the p-type InGaAsP layer 310 have the same configuration as the semiconductor laser region on the left side in FIG. 9. A part of the n-type InP substrate 301, the EA portion n-type InGaAsP-SCH layer 303', the EA portion InGaAsP-MQW layer 305', and the EA portion p-type InGaAsP-SCH layer 306' form a mesa structure having a width of 1.0 µm, and the left and right sides thereof are buried with an InP layer 312 doped with Fe or Ru having a high resistance. The InP layer 312 have the same configuration as the semiconductor laser region on the left side in FIG. 9.

As in the semiconductor laser region, the p-type InP layer 307 to the p-type InGaAsP layer 310 form an upper cladding layer 317 having a mesa structure with a width of 1.0 µm, and the left and right sides and a part of the upper side are covered with a SiO$_2$ insulating film 314. A current injection layer 311' having a width of 0.5 µm that is less than that of the upper cladding layer 317 is provided on the p-type InGaAsP layer 310. Since the width of the current injection layer 311' is less than that of the upper cladding layer 317, light leaks to some extent in 311' but is not guided in a resonator direction in 311'. A combination of the upper cladding layer 317, the SCH layers 303' and 306', the MQW layer 305', and the n-type InP substrate 301 functioning as the lower cladding layer form a waveguide such that light is guided in an optical axis direction inside the electro-absorption modulator. A p-type InGaAs contact layer 313' is provided on the current injection layer 311' and is in ohmic contact with a p-type electrode 315'. The current injection layer 311' does not guide light. Therefore, the height of the current injection layer 311' may be small and only has to be 0.2 µm or more. In the region of the electro-absorption modulator, a polyimide film 322 is inserted between the SiO$_2$ insulating film 314 and the p-type electrode 315' in order to reduce the capacity.

In the region around the center in FIG. 9, the waveguide layer (WG portion) that optically connects the semiconductor laser and the electro-absorption modulator has a structure similar to the electro-absorption modulator. The cross-sectional structure perpendicular to the optical axis is not illustrated. A mesa structure having a width of 1.0 µm including a WG portion lower InGaAsP-SCH layer 323, a WG portion InGaAsP core layer 324, and a WG portion upper InGaAsP-SCH layer 325 is provided, and the left and right sides of the mesa structure are buried with the InP layer 312 doped with Fe or Ru. As in the electro-absorption modulator region, the upper cladding layer is formed by the p-type InP layer 307 and the p-type InGaAsP layer 310 and has a mesa structure having a width of 1.0 µm. A SiO$_2$ insulating film is provided on a side of the mesa structure of the upper cladding layer. Since it is not necessary to cause a current to flow through the waveguide layer, a contact layer and an electrode are not provided. In addition, in order to increase electric resistance between the semiconductor laser region and the electro-absorption modulator, the thickness of the current injection layer 311' is small at 0.1 µm.

In an implementation, the optical confinement factor of the MQW layer 305' is higher than that of a typical electro-absorption modulator having a buried structure by about 5% to about 15%. Therefore, light can be modulated with a lower modulation voltage magnitude. Alternatively a high extinction ratio can be obtained with a configuration where the modulator length is short. The reason for this is that the upper cladding layer 317 includes the InGaAsP upper separate confinement heterostructure layer 310, the average refractive index is higher than that of the current injection layer 311', and the width of the current injection layer 311' is less than that of the upper cladding layer 317. In addition, since the optical confinement factor increases in the semiconductor laser, laser oscillation can be realized at a low threshold current.

In the semiconductor optical device according to an implementation in which the semiconductor laser and the electro-absorption modulator are integrated, an antireflection coating having a reflectance of 0.1% or lower is formed on a front end surface on a side where the electro-absorption modulator is provided, and a high-reflection coating having a reflectance of 90% is formed on a rear end surface on a side where the semiconductor laser is provided. In addition, a diffraction grating structure in which the resonator length of the semiconductor laser is 300 µm and a λ/4 shift is provided at a position at a distance of 35 µm from the rear end surface is obtained. Threshold currents of the semiconductor laser region according to an implementation at 25° C. and 85° C. are 6.7 mA and 14.2 mA, which are low values.

The modulator length of the electro-absorption modulator is 70 µm and can be reduced by about 20% to about 50% as compared to the related art. The capacity of a pin diode including the EA portion n-type InGaAsP-SCH layer 303', the EA portion InGaAsP-MQW layer 305', and the EA portion p-type InGaAsP-SCH layer 306' can be reduced. In an implementation, the total capacity including the electrode of the electro-absorption modulator can be reduced up to 0.13 pF. In the semiconductor optical device in which the electro-absorption modulator is integrated by reflecting this low capacity, a high band of 64 GHz can be obtained. Further, in the semiconductor laser region and the modulator region, the estimated lifetime at 85☐C is $2.8 \times 10^5$ hours, and high reliability can be obtained.

In an implementation, the InGaAsP semiconductor layer is used as the MQW layer and the SCH layer in the semiconductor laser region and the electro-absorption modulator region. However, it is needless to say that, even when an InGaAlAs semiconductor layer is used, the same effects can be obtained.

A single semiconductor laser and the optical device in which the semiconductor laser and the electro-absorption modulator are integrated has been described. However, it is needless to say that an integrated semiconductor laser in which a passive waveguide is provided in front of a semiconductor laser or an MZ modulator-integrated semiconductor laser in which a Mach-Zehnder modulator is integrated can be configured using the method.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical element configured to emit or absorb light, the semiconductor optical element comprising:
   a lower structure that includes a multiple quantum well layer;
   an upper mesa structure that is disposed on the lower structure;
   a current injection structure that is disposed on the upper mesa structure,
      when seen from an optical axis of the emitted or absorbed light, a width of a portion of the current injection structure in contact with the upper mesa structure is smaller than a width of the upper mesa structure,
      the portion of the current injection structure in contact with the upper mesa structure consisting of InP, and
      an average refractive index of the upper mesa structure is higher than a refractive index of the InP forming the current injection structure; and
   an insulating film covering both side surfaces of the upper mesa structure and a part of an upper surface of the upper mesa structure.

2. The semiconductor optical element of claim 1, wherein the upper mesa structure includes a diffraction grating layer,
   the lower structure forms not the upper mesa structure and one mesa structure, and
   the semiconductor optical element further comprises:
      a buried semiconductor layer that buries both side surfaces of the lower structure.

3. The semiconductor optical element of claim 2, wherein the diffraction grating layer is formed of InGaAsP.

4. The semiconductor optical element of claim 1, wherein the lower structure includes a lower separate confinement heterostructure layer that is provided above the multiple quantum well layer and has a bandgap greater than a bandgap of the multiple quantum well layer, the upper mesa structure includes an upper separate confinement heterostructure layer that is provided above the lower separate confinement heterostructure layer and has a bandgap greater than a bandgap of the multiple quantum well layer, and the semiconductor optical element further comprises:
a buried semiconductor layer that buries both side surfaces of the lower structure.

5. The semiconductor optical element of claim 4, wherein the upper separate confinement heterostructure layer and the lower separate confinement heterostructure layer are formed of InGaAsP.

6. The semiconductor optical element of claim 1, wherein the current injection structure is narrower than a width of the upper mesa structure by 0.05 µm or greater.

7. The semiconductor optical element of claim 6, wherein the current injection structure has a width in a range of 0.1 µm to 0.7 µm.

8. The semiconductor optical element of claim 7, wherein a height of the current injection structure is less than 1 µm.

9. The semiconductor optical element of claim 1, wherein the current injection structure is one of at least two current injection structures.

10. The semiconductor optical element of claim 1, wherein the multiple quantum well layer is a layer consisting of multiple elements including Al.

11. The semiconductor optical element of claim 1, wherein the upper mesa structure further includes a separate confinement heterostructure layer having a higher refractive index than the current injection structure.

12. The semiconductor optical element of claim 11, wherein the separate confinement heterostructure layer is formed of InGaAsP.

13. A semiconductor optical device comprising:
a semiconductor optical element configured to emit or absorb light, the semiconductor optical element comprising:
a lower structure that includes a multiple quantum well layer;
an upper mesa structure that is disposed on the lower structure;
a current injection structure that is disposed on the upper mesa structure,
when seen from an optical axis of the emitted or absorbed light, a width of a portion of the current injection structure in contact with the upper mesa structure is smaller than a width of the upper mesa structure,
the portion of the current injection structure in contact with the upper mesa structure consisting of InP, and
an average refractive index of the upper mesa structure is higher than a refractive index of the InP forming the current injection structure; and
an insulating film covering both side surfaces of the upper mesa structure and a part of an upper surface of the upper mesa structure; and
a semiconductor laser integrated with the semiconductor optical element.

14. The semiconductor optical device of claim 13, wherein
the upper mesa structure includes a diffraction grating layer,
the lower structure forms not the upper mesa structure and one mesa structure, and
the semiconductor optical element further comprises:
a buried semiconductor layer that buries both side surfaces of the lower structure.

15. The semiconductor optical device of claim 14, wherein the diffraction grating layer is formed of InGaAsP.

16. The semiconductor optical device of claim 13, wherein
the lower structure includes a lower separate confinement heterostructure layer that is provided above the multiple quantum well layer and has a bandgap greater than a bandgap of the multiple quantum well layer,
the upper mesa structure includes an upper separate confinement heterostructure layer that is provided above the lower separate confinement heterostructure layer and has a bandgap greater than a bandgap of the multiple quantum well layer, and
the semiconductor optical element further comprises:
a buried semiconductor layer that buries both side surfaces of the lower structure.

17. The semiconductor optical device of claim 13, wherein the current injection structure is narrower than a width of the upper mesa structure by 0.05 µm or greater.

18. The semiconductor optical device of claim 13, wherein the current injection structure is one of at least two current injection structures.

19. The semiconductor optical device of claim 13, wherein the multiple quantum well layer is a layer consisting of multiple elements including Al.

20. The semiconductor optical device of claim 13, wherein the upper mesa structure further includes a separate confinement heterostructure layer having a higher refractive index than the current injection structure.

* * * * *